United States Patent [19]
Lee et al.

[11] Patent Number: 6,077,738
[45] Date of Patent: Jun. 20, 2000

[54] INTER-LEVEL DIELECTRIC PLANARIZATION APPROACH FOR A DRAM CROWN CAPACITOR PROCESS

[75] Inventors: Yu-Hua Lee, Hsinchu; Cheng-Ming Wu, Kao-Hsiung; Tze-Liang Ying, Hsin-Chu, all of Taiwan

[73] Assignee: Taiwan Semiconductor Manufacturing Company, Hsin-Chu, Taiwan

[21] Appl. No.: 09/344,398

[22] Filed: Jun. 25, 1999

[51] Int. Cl.[7] ............... H01L 21/8242; H01L 21/20; H01L 27/10
[52] U.S. Cl. ............... 438/241; 438/396; 438/397; 257/296; 257/306
[58] Field of Search .................... 438/239, 256, 438/253, 241, 396, 210; 257/296, 298

[56] References Cited

U.S. PATENT DOCUMENTS

| | | | |
|---|---|---|---|
| 5,386,382 | 1/1995 | Ahn | 257/296 |
| 5,405,800 | 4/1995 | Ogawa et al. | 437/52 |
| 5,488,007 | 1/1996 | Kim et al. | 437/47 |
| 5,597,756 | 1/1997 | Fazan et al. | 437/52 |
| 5,623,164 | 4/1997 | Auer et al. | 257/752 |
| 5,674,773 | 10/1997 | Koh et al. | 437/60 |
| 5,759,889 | 6/1998 | Sakao | 438/241 |
| 5,792,680 | 8/1998 | Sung et al. | 438/210 |
| 5,827,766 | 10/1998 | Lou | 438/253 |
| 5,843,817 | 12/1998 | Lee et al. | 438/239 |
| 5,858,831 | 1/1999 | Sung | 438/241 |
| 5,897,350 | 4/1999 | Lee et al. | 438/238 |

*Primary Examiner*—Matthew Smith
*Assistant Examiner*—Lex H. Malsawma
*Attorney, Agent, or Firm*—George O. Saile; Stephen B. Ackerman

[57] ABSTRACT

A process for obtaining global planarization, or a smooth top surface topography, for an insulator layer overlying a semiconductor chip, with DRAM device structures, featuring crown shaped capacitor structures, and with peripheral, non-DRAM devices, has been developed. The process features the use of a thin silicon nitride shape, used as a hard mask, overlying insulator layers in the peripheral, non-DRAM device region, and used to prevent removal of these underlying insulator layers, during a wet etch procedure which is used to expose the vertical features of crown shaped, storage node structures, in the DRAM device region. The prevention of removal of insulator, located overlying the peripheral, non-DRAM device region, allows a subsequent, planarized, overlying insulator layer, to provide the desired smooth top surface topography for the entire semiconductor chip.

26 Claims, 9 Drawing Sheets

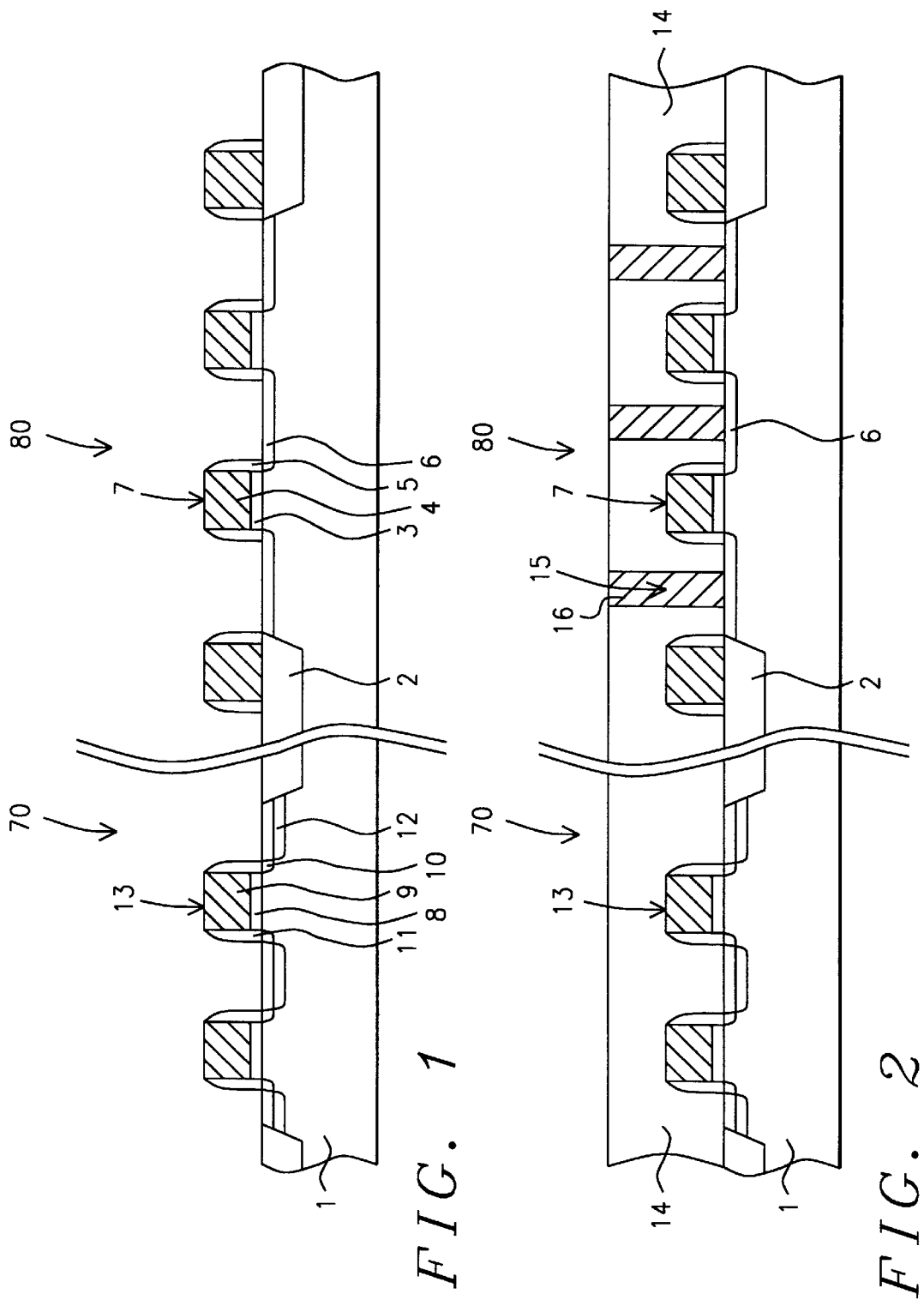

ions of

INTER-LEVEL DIELECTRIC PLANARIZATION APPROACH FOR A DRAM CROWN CAPACITOR PROCESS

BACKGROUND OF THE INVENTION

(1) Field of the Invention

The present invention relates to methods used to fabricate semiconductor devices, and more specifically to a method used to obtain global planarization for semiconductor chips comprised of DRAM cells, with crown capacitor structures, and also comprised of devices in peripheral regions, exhibiting less severe topography than encountered in the DRAM cell.

(2) Description of Prior Art

Crown shaped capacitor structures, comprised with various configurations of vertical features, have allowed the capacitance of dynamic random access memory, (DRAM), devices, to be increased without increasing the horizontal dimension of the DRAM device. This attractive approach, allowing increases in DRAM device densities to be realized, can however present difficulties when subsequent metal wiring procedures are performed. The large difference in height between the DRAM cell, comprised with the severe crown shaped topography, and the flatter peripheral region, comprised of conventional transfer gate transistors, can result in electrical opens or shorts, when metal interconnect structures traverse the severe topography created with the use of DRAM, crown shaped capacitor structures.

This invention will describe a fabrication process sequence for global planarization of the inter-level dielectric, (ILD), layers that overlay both the crown shaped, DRAM devices, as well as peripheral, or non-DRAM, logic device regions. The process features the use of a thin silicon nitride shape, used to protect peripheral region, ILD layers, from insulator removal procedures, used to expose the vertical features of the DRAM crown shaped capacitor structure. Prior art, such as Auer et al, in U.S. Pat. No. 5,623,164, as well as Koh et al, in U.S. Pat. No. 5,674,773, describe methods such as chemical mechanical polishing, and reflowable ILD layers, to achieve global planarization, however these prior arts do not use the novel silicon shape, described in this invention, to preserve the ILD layers, residing in non-DRAM regions, thus allowing global planarization to be realized.

SUMMARY OF THE INVENTION

It is an object of this invention to fabricate DRAM devices, featuring crown shaped capacitor structures, in a first region of a semiconductor substrate, while fabricating peripheral, non-DRAM devices, in a second region of the semiconductor substrate.

It is another object of this invention to provide a process that allows global planarization, to be achieved for ILD layers, overlaying both DRAM devices, comprised with crown shaped, capacitor structure, and peripheral, non-DRAM devices.

It is still another object of this invention to achieve global planarization via the use a thin silicon nitride shape, used to protect the regions of ILD layers, overlaying the peripheral, non-DRAM devices, during insulator removal procedures, that are in turn used to expose vertical features of the DRAM crown capacitor structure.

In accordance with the present invention a process is described that allows global planarization to be achieved for ILD layers overlying both DRAM regions, comprised with crown shaped, capacitor structures, and peripheral, non-DRAM regions. After formation of the transfer gate transistors, in both the DRAM device region, and in the peripheral device region, storage node contact plugs are formed in a planarized, first insulator layer, contacting source/drain regions, in the DRAM device region. A second insulator layer, and a thin silicon nitride layer, are next deposited, followed by a patterning procedure, resulting in the formation of a thin silicon nitride shape, overlying the second insulator layer, only in the peripheral device region. A third insulator layer is deposited, overlying the thin silicon nitride shape, in the peripheral device region, while overlying the second insulator layer, in the DRAM device region. Capacitor openings are made in the third insulator layer, and in the second insulator layer, in the DRAM device region, exposing the top surface of the storage node contact plugs. A polysilicon layer, or a hemispherical grain, (HSG), silicon layer is next deposited, followed by removal of the polysilicon or HSG silicon layer, in regions in which the polysilicon, or HSG silicon layer overlaid the top surface of the third insulator layer, resulting in crown shaped, storage node structures, in the capacitor openings, contacting the underlying storage node contact plugs. Selective removal of the third insulator, in the peripheral device region, exposes the top surface of the thin silicon nitride shape, in the peripheral region, while the same procedure removes the third and second insulator layers, in the DRAM device region, exposing the vertical features of the crown shaped capacitor structures. Subsequent formation of a capacitor dielectric layer, on the exposed surfaces of the crown shaped capacitor structure, followed by the formation of the polysilicon upper plate, result in the formation of the crown shaped capacitor structures. A fourth insulator layer, is deposited on the underlying topography, comprised of crown shaped capacitor structures, in the DRAM device region, and the flat surface of the second insulator layer, in the peripheral device region, followed by a planarization procedure, resulting in a smooth top surface topography, overlying both regions of the semiconductor substrate.

BRIEF DESCRIPTION OF THE DRAWINGS

The object and other advantages of this invention are best described in the preferred embodiments with reference to the drawings that include:

FIGS. 1–10, which schematically, in cross-sectional style, describe key stages of fabrication, used to create the global planarization of ILD layers, overlying a DRAM device region, comprised with crown shaped capacitor structures, and peripheral, non-DRAM device regions.

DESCRIPTION OF THE PREFERRED EMBODIMENTS

Figure 3:
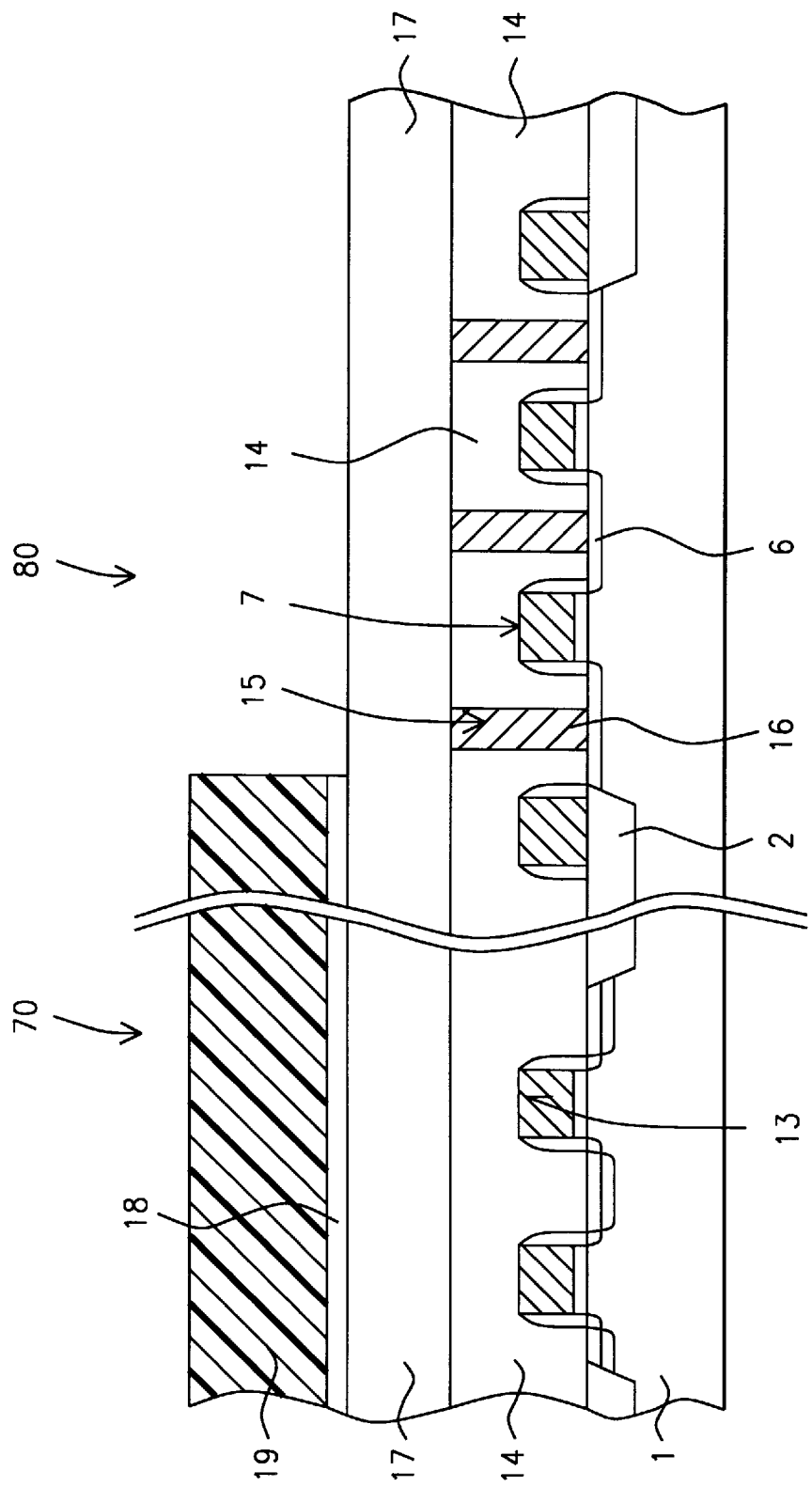

The process for achieving a smooth top surface topography, or global planarization, of inter-level dielectric, (ILD), layers, overlying DRAM devices, comprised with crown shaped, capacitor structures, and overlying non-peripheral DRAM devices, will now be described in detail. A P type, semiconductor substrate 1, comprised of single crystalline silicon, with a <100> crystallographic orientation, is used and schematically shown in FIG. 1. Region 80, will be used for fabrication of DRAM devices, comprised with crown shaped, capacitor structures, while region 70, of semiconductor substrate 1, will be used for fabrication of peripheral, non-DRAM devices, exhibiting less severe topography than the counterpart DRAM devices. Isolation regions 2, comprised of either insulator filled shallow trench regions, or thermally grown, field oxide regions, are first formed to provide the needed isolation between DRAM device region 80, and peripheral, non-DRAM device region 70. DRAM gate structure 7, is comprised of either doped polysilicon, or a polycide, (metal silicide—polysilicon), layer 4, on underlying silicon dioxide gate insulator layer 3. For this invention, the transfer gate transistors, for both DRAM device region 80, as well as for peripheral, non-DRAM device region 70, will be N channel type devices, therefore lightly doped source/drain regions 6, will be N type. Insulator spacers 5, comprised of either silicon oxide, or silicon nitride, are formed on the sides of DRAM gate structures 7, after the formation of N type, lightly doped source/drain regions 6. This is schematically shown in FIG. 1.

Gate structures 13, used in peripheral, non-DRAM device region 70, are comprised of either of doped polysilicon, or polycide layer 9, on an underlying silicon dioxide gate insulator layer 8. After formation of N type, lightly doped source/drain regions 10, insulator spacers 11, again comprised of either silicon oxide, or silicon nitride, are formed on the sides of gate structures 13. Heavily doped, N type, source/drain regions 12, are than formed, completing the fabrication of the N channel, transfer gate transistors, in peripheral, non-DRAM device region 70. This is schematically shown in FIG. 1. Although the transfer gate transistors used for both DRAM device region 80, and peripheral, non-DRAM device 70, were described as N channel devices, this invention can also be applied to P channel type, DRAM, and non-DRAM devices, via the formation of an N well region, in semiconductor substrate 1, and the creation of P type, source/drain regions.

A first insulator layer 14, comprised of either silicon oxide, or borophosphosilicate glass, (BPSG), is next deposited, via either low pressure chemical vapor deposition, (LPCVD), or plasma enhanced chemical vapor deposition, (PECVD), at a thickness between about 3000 to 7000 Angstroms. A chemical mechanical polishing, (CMP), procedure is than employed for planarization purposes, resulting in a smooth top surface topography for first insulator layer 14, overlying the transfer gate transistors of both DRAM device region 80, and of peripheral, non-DRAM device region 70. This is schematically shown in FIG. 2. Conventional photolithographic and reactive ion etching, (RIE), procedures, using $CHF_3$ as an etchant for first insulator layer 14, are then used to open storage node contact holes 15, exposing a portion of the top surface of lightly doped source/drain regions 6, in DRAM device region 80. After removal of the photoresist shape, used for definition of storage node contact holes 15, via plasma oxygen ashing, and careful wet cleans, a polysilicon layer is deposited via LPCVD procedures, at a thickness between about 5000 to 10000 Angstroms. The polysilicon layer is doped in situ, during deposition, via the addition of phosphine to a silane ambient, resulting in a polysilicon layer with a phosphorous surface concentration between about 1E19 to 1E21 atoms/$cm^3$. Removal of the regions of the doped polysilicon layer, residing on the top surface of first insulator layer 14, is accomplished via the use of a CMP procedure, or via the use of a selective RIE procedure, using $Cl_2$ as an etchant, resulting in the formation of storage node contact plugs 16, in storage node contact holes 15. This is schematically shown in FIG. 2.

Figure 4:
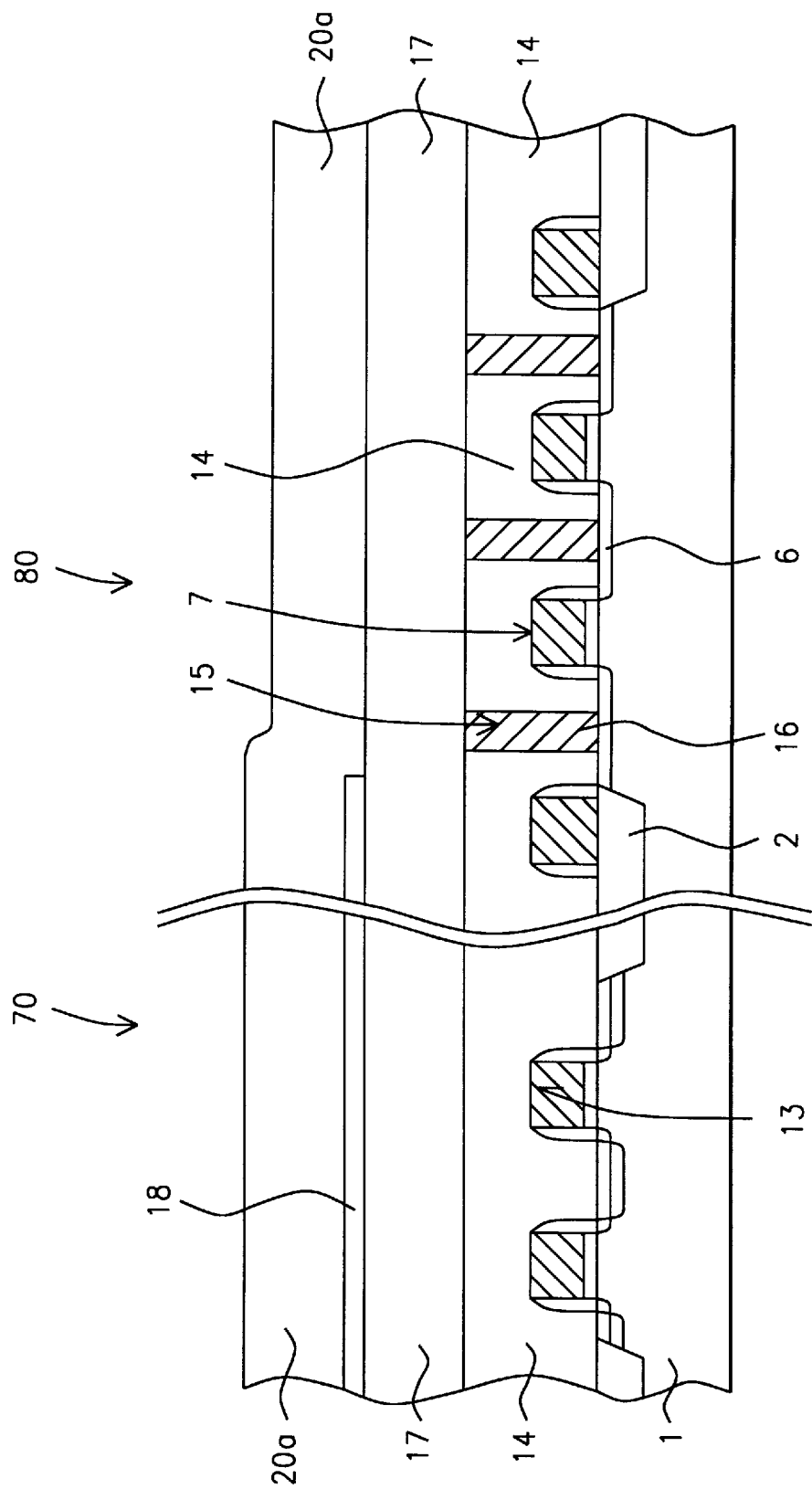

A second insulator layer, or ILD layer 17, comprised of silicon oxide, or of BPSG, is next deposited, via LPCVD or PECVD procedures, at a thickness between about 9000 to 10000 Angstroms, followed by the deposition of thin silicon nitride layer 18, again via LPCVD or PECVD procedures, at a thickness between about 100 to 500 Angstroms. Thin silicon nitride layer 18, to be used as a hard mask for subsequent protection of the insulator layers in peripheral, non-DRAM device region 70, from a wet etch procedures used to expose the vertical features of the DRAM crown shaped capacitor structure, can be replaced by a thin silicon oxynitride layer, if desired. Photoresist shape 19, is then formed, and used as a mask, to allow the region of thin silicon nitride layer 18, overlying second insulator layer 17, in DRAM device region 80, to be removed via a selective RIE procedure, using $Cl_2$ as an etchant. This is schematically shown in FIG. 3. After removal of photoresist shape 19, via plasma oxygen ashing and careful wet cleans, a third insulator layer, or ILD layer 20a, again comprised of either silicon oxide, or BPSG, is deposited via LPCVD or PECVD procedures, at a thickness between about 3000 to 5000 Angstroms. Third insulator layer 20a, shown schematically in FIG. 4, overlays thin silicon nitride layer 18, in peripheral, non-DRAM device region 70, while overlaying second insulator layer 17, in DRAM device region 80.

Figure 5:
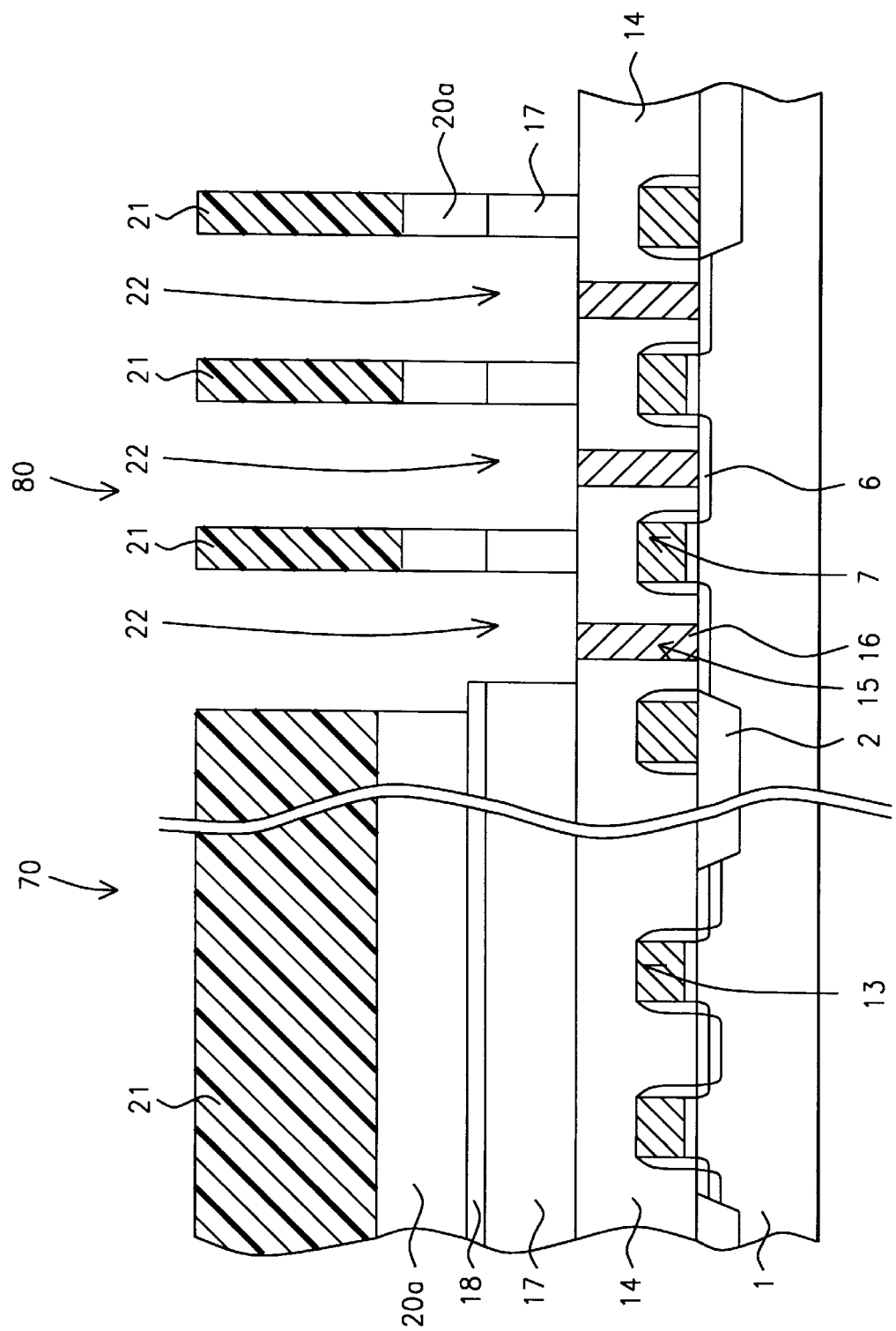

The creation of capacitor openings 22, is next addressed, and schematically shown in FIG. 5. Photoresist shape 21, is formed and used as a mask to allow an anisotropic RIE procedure, using $CHF_3$ as an etchant, to create capacitor openings 22, in third insulator layer 20a, and in second insulator layer 17, exposing the top surfaces of storage node contact plugs 16. The RIE procedure is selective in regards to terminating at the appearance of thin silicon nitride layer 18, at the left edge of DRAM device region 80, with the RIE procedure also terminating at the appearance of the top surface of storage node contact plugs 16. Photoresist shape 21, is then removed via plasma oxygen ashing and carefil wet cleans. The width, or diameter, of capacitor openings 22, is between about 3500 to 4500 Angstroms, and the space between capacitor openings 22, is between about 1000 to 2000 Angstroms.

Figure 6:
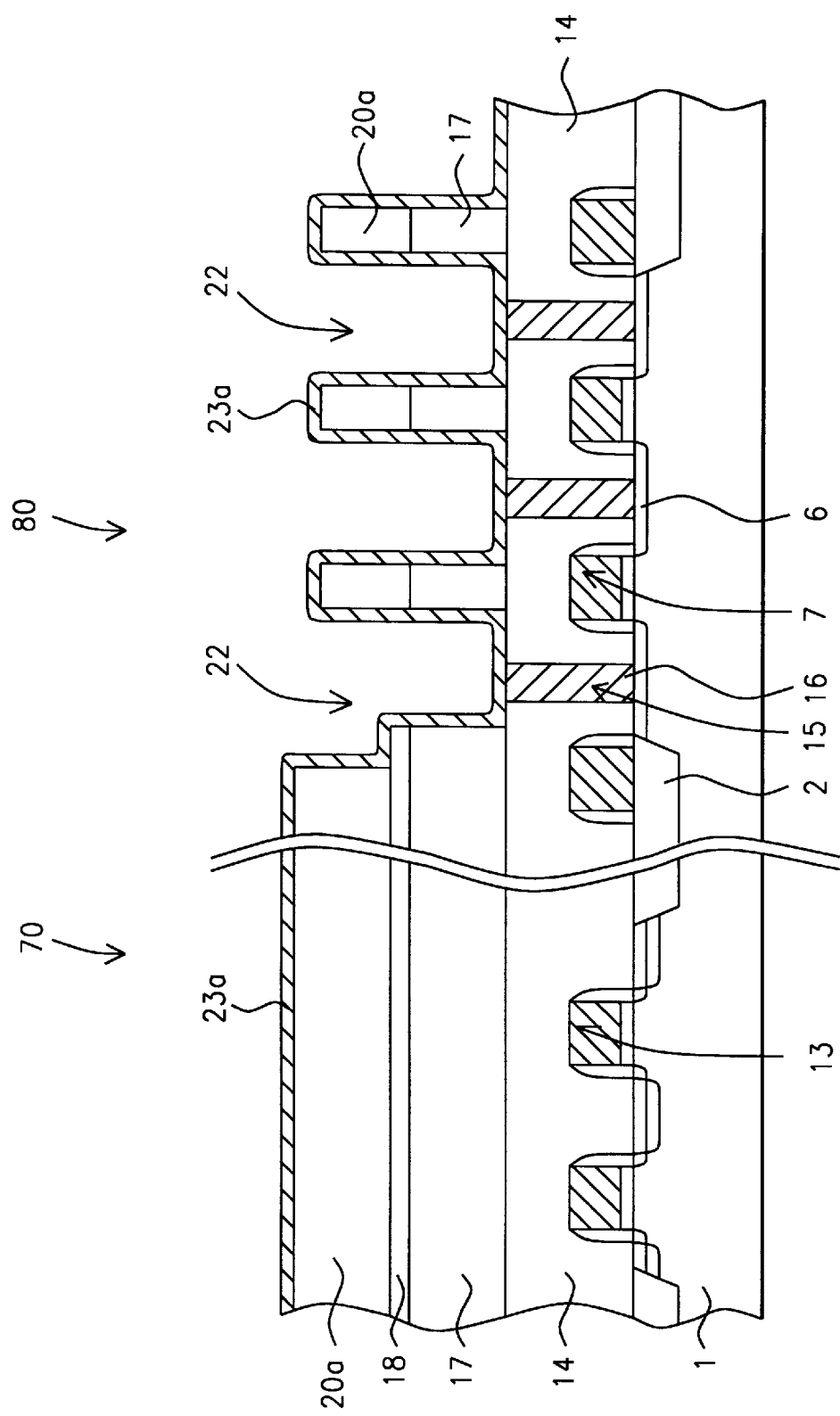

A polysilicon layer 23a, to be subsequently patterned to form a DRAM capacitor, storage node structure, is next deposited via LPCVD procedures, at a thickness between about 500 to 1000 Angstroms. Polysilicon layer 23a, shown schematically in FIG. 6, is doped in situ during deposition, via the addition of phosphine, to a silane ambient, and coats all surfaces of capacitor openings 22, regarding the sides of capacitor openings 22, comprised of third insulator layer 20a, and second insulator layer 17, as well as coating the bottom of capacitor openings 22, where polysilicon layer 23a, overlays, and contacts, the top surface of storage node contact plugs 16. Another option is to use a hemispherical grain, (HSG), silicon layer, in place of polysilicon layer 23a. The HSG silicon layer, comprised with concave and convex features, offers increased surface area, and thus increased capacitance, when compared to the smooth top surface of polysilicon. The HSG silicon layer is obtained via deposition of an amorphous silicon layer, followed by annealing procedures, allowing a roughened surface, or the HSG silicon layer, to be formed from the amorphous silicon layer.

Figure 7:
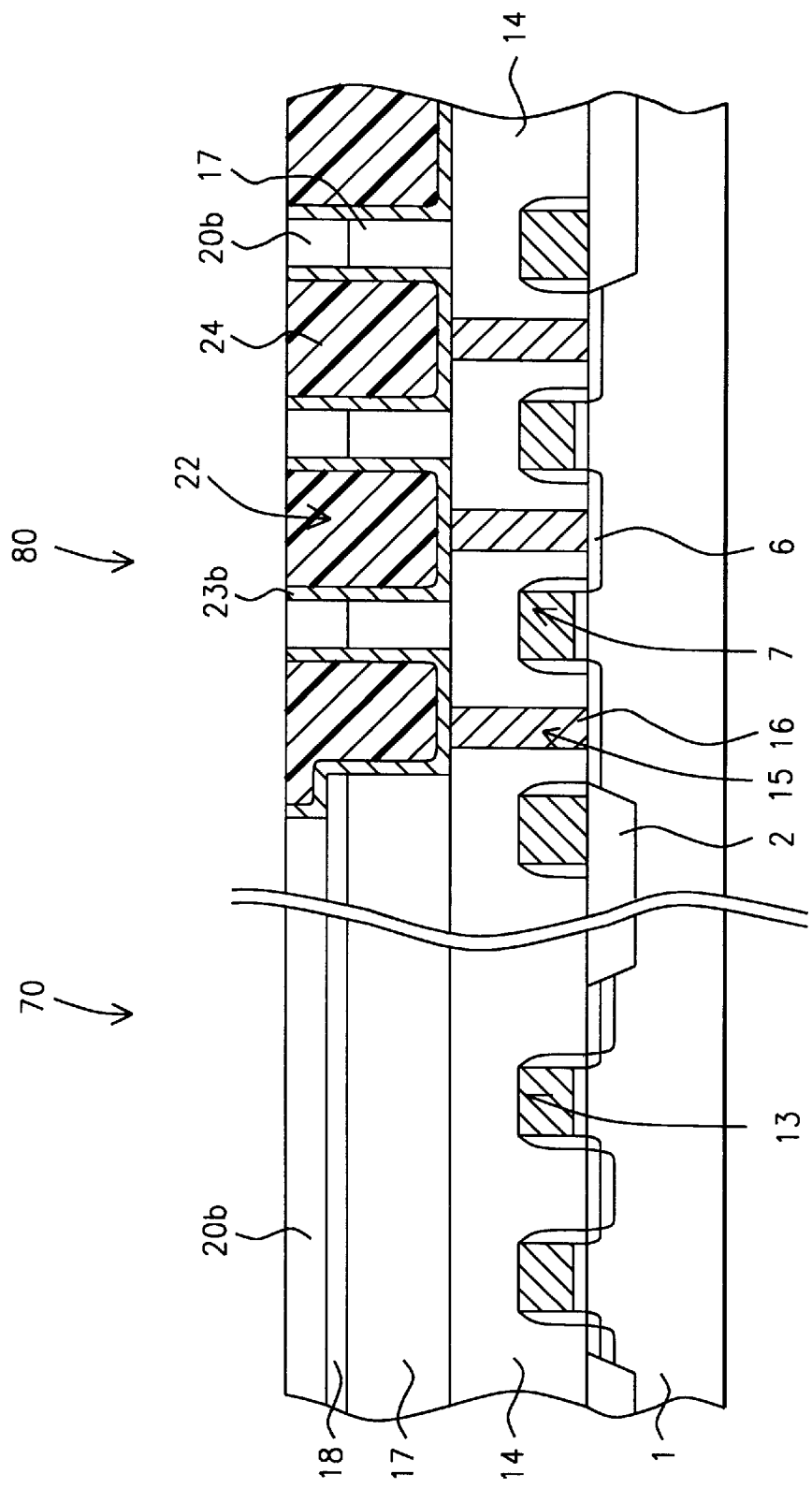

A photoresist layer is next applied and subjected to procedures, such as exposure—development, or CMP, to remove the top portion of the photoresist layer, leaving only photoresist plugs 24, in capacitor openings 22, protecting the regions of polysilicon, or HSG silicon layer 23a, located on the sides of capacitor openings 22, from another CMP, or from a selective RIE procedure, using $Cl_2$ as an etchant, to remove exposed regions of polysilicon or HSG silicon layer 23a, resulting in crown shaped storage node structures 23b, schematically shown in FIG. 7. A second option is to use only one CMP procedure to remove the top portion of the photoresist layer, while continuing the CMP procedure to remove the now exposed portions of polysilicon layer, or HSG silicon layer 23a, again resulting in the creation of crown shaped, storage node structures 23b, in capacitor openings 22, protected by photoresist plugs 24. The second CMP procedure, used with the first option, or the one CMP procedure, used with the second option, results in removal of a top portion of third insulator layer 20a, resulting in thinned, insulator layer 20b. This is schematically shown in FIG. 7. Removal of photoresist plugs 24, is accomplished again via plasma oxygen ashing and careful wet cleans.

Figure 8:
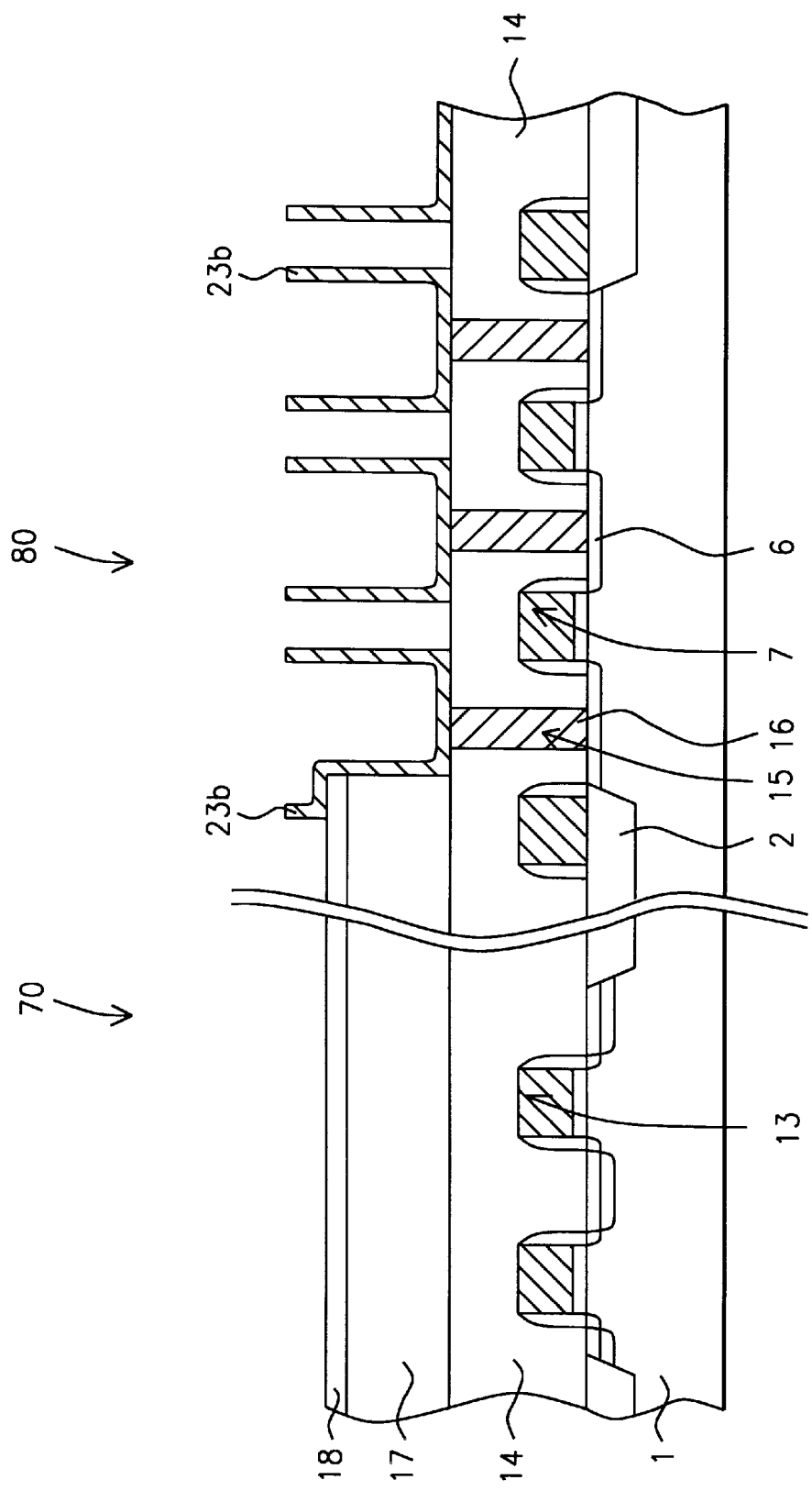

A critical aspect of this invention, the removal of insulator layer 20b, and the removal of second insulator layer 17, in DRAM device region 80, is next addressed, and schematically shown in FIG. 8. A wet etch procedure, using a buffered hydrofluoric acid solution, or a dilute hydrofluoric acid solution, is employed to remove insulator layer 20b, and second insulator layer 17, in DRAM device region 80, exposing the vertical features of crown shaped, storage node structures 23b. Thin silicon nitride shape 18, protected the portion of second insulator layer 17, located in peripheral, non-DRAM device region 70, from this wet etch procedure, thus preserving the thickness of insulator layer, needed in peripheral, non-DRAM device region 70, to allow subsequent global planarization, or smooth topographies, to be realized.

Figure 9:
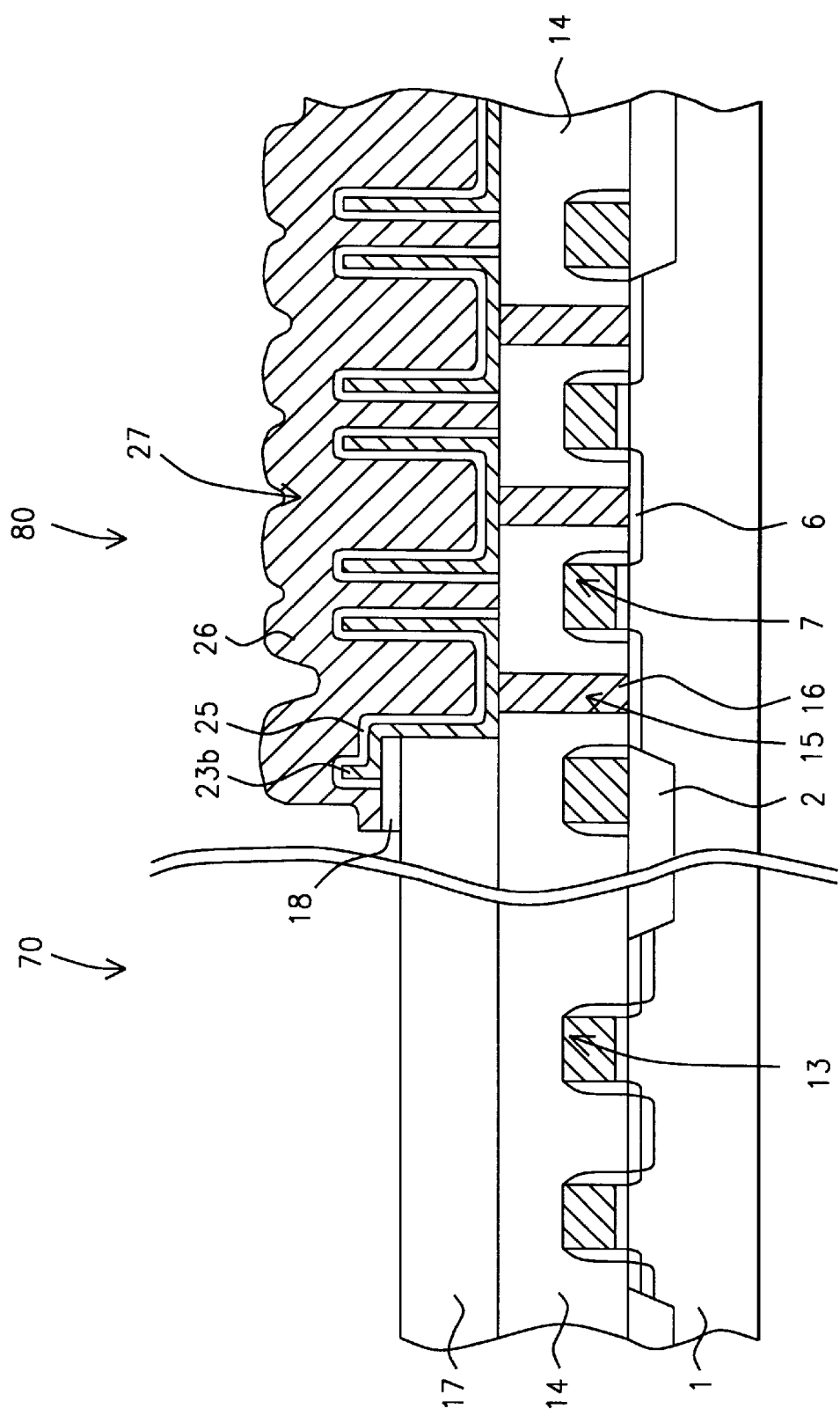
Figure 10:
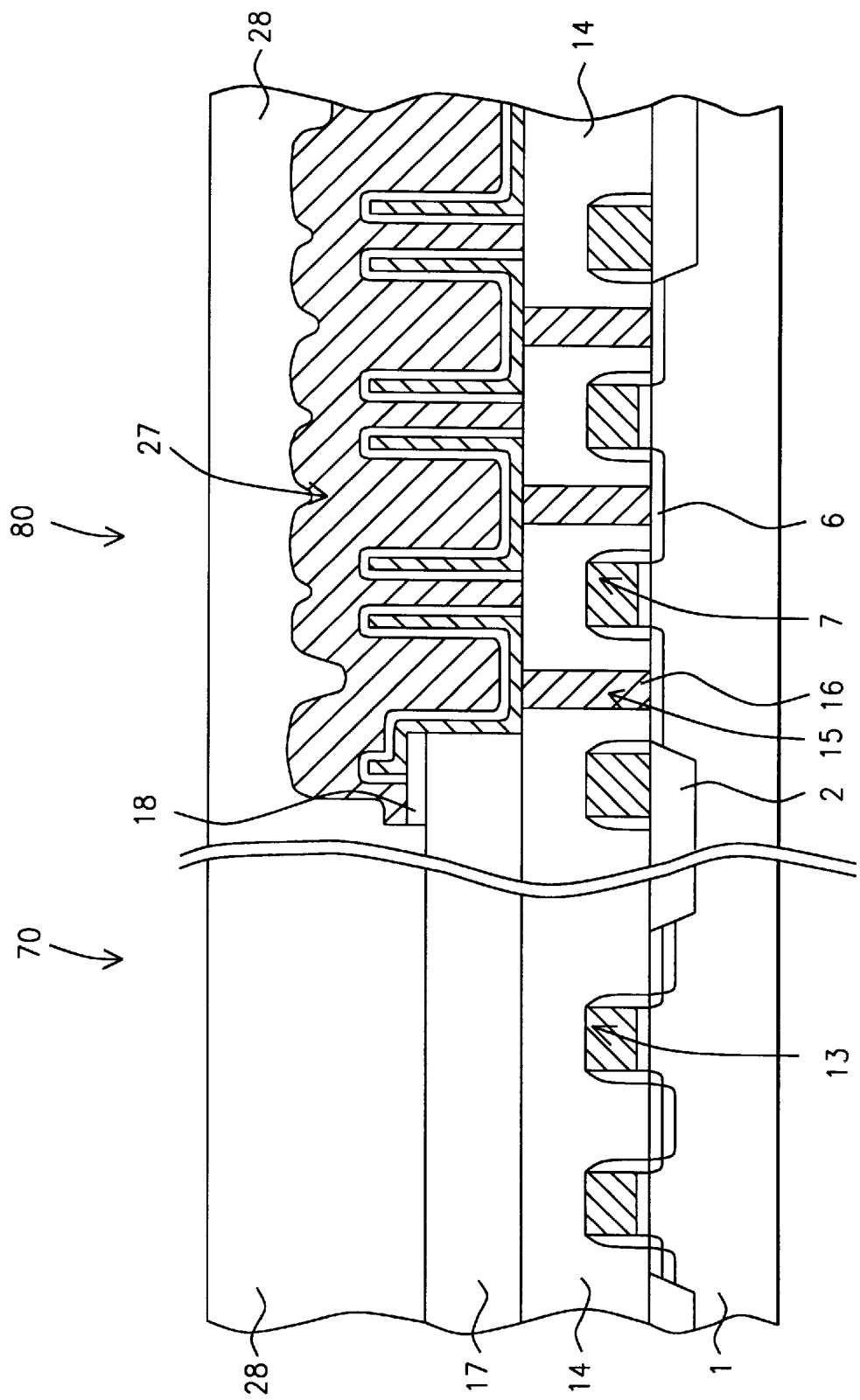

The completion of the DRAM crown shaped capacitor structure is next addressed and schematically shown in FIGS. 9–10. A capacitor dielectric layer 25, such as tantalum oxide, or ONO, (Oxidized Nitride on Oxide), is formed on the exposed surfaces of crown shaped, storage node structures 23b, at an equivalent silicon oxide thickness between about 40 to 80 Angstroms. A polysilicon layer is next deposited via LPCVD procedures, at a thickness between about 750 to 1250 Angstroms, filling the spaces between vertical features of a specific crown shaped, storage node structure 23b, as well as filling the spaces between the crown shaped, storage node structures. The polysilicon layer is doped in situ, during deposition, via the addition of arsine, or phosphine, to a silane ambient. Conventional photolithographic and RIE procedures, using $Cl_2$ as an etchant, are used to create upper polysilicon plate 26, shown schematically in FIG. 9. After definition of upper polysilicon plate 26, the RIE procedure is continued to remove the exposed region of thin silicon nitride layer 18, from the top surface of second insulator layer 17, in peripheral, non-DRAM device region 70. The removal of the high dielectric constant silicon nitride layer, will reduce unwanted capacitance, resulting in device performance improvements. However the thin silicon nitride layer, remained in place in peripheral, non-DRAM device region 70, during insulator layer removal procedures, applied to insulator layers in DRAM device region 80, thus allowing subsequent global planarization to be easily accomplished. In addition if second insulator layer 17, would have been thinned or removed in peripheral, non-DRAM device region 70, patterning of upper polysilicon plate 26, would be difficult. DRAM crown shaped, capacitor structure 27, comprised of upper polysilicon plate 26, capacitor dielectric layer 25, and crown shaped, storage node structures 23b, is schematically shown in FIG. 9. As a result of the filling of the spaces between vertical features of the crown shaped storage node structures, as well as the filling of the spaces between these structures, during the upper polysilicon plate deposition DRAM crown shaped, capacitor structure 27, exhibits a smooth top surface topography.

A fourth insulator layer, or ILD layer 28, comprised of either silicon oxide, or BPSG, is deposited via LPCVD or PECVD procedures, at a thickness between about 2000 to 5000 Angstroms. A CMP procedure is then employed to planarize the top surface of fourth insulator layer 28, resulting in global planarization, or a smooth top surface topography for the series of insulator layers overlaying both peripheral, non-DRAM device region 70, and DRAM device region 80. This is schematically shown in FIG. 10. The desired global planarization was aided by the ability to form a DRAM capacitor structure, with a smooth top surface topography, as well as the ability to retain second insulator layer 17, in peripheral, non-DRAM device region 70, during removal of this layer, in DRAM device region 80. This in turn was accomplished via the use of thin silicon nitride shape 18, used as an etch stop during the wet etch removal of insulator layers, in DRAM device region 80.

While this invention has been particularly shown and described with reference to the preferred embodiments thereof, it will be understood by those skilled in the art that various changes in form and detail may be made without departing from the spirit or scope of the invention.

What is claimed is:

1. A method of forming a planarized top surface topography for an insulator layer overlying DRAM devices, comprised with crown shaped capacitor structures, and overlying peripheral, non-DRAM devices, on respective regions of a semiconductor substrate, comprising the steps of:

providing a first set of transfer gate transistors, for said DRAM devices, in a first portion of said semiconductor substrate, and providing a second set of transfer gate transistors, for said peripheral, non-DRAM devices, in a second portion of said semiconductor substrate, with storage node contact plugs, located in storage node contact holes, formed in a first insulator layer, contacting source/drain regions, of said first set of transfer gate transistors;

forming a thin insulator mask, and a second insulator layer, overlying said first insulator layer, in said peripheral, non-DRAM device region, while only said second insulator layer, overlays said first insulator layer, in said DRAM device region;

depositing a third insulator layer, and forming capacitor openings in said third insulator layer, and in said second insulator layer, exposing the top surface of said storage node contact plugs, in said DRAM device region;

forming crown shaped, storage node structures, in said capacitor openings;

removing said third insulator layer, and said second insulator layer, in said DRAM device region, exposing vertical sides of said crown shaped storage node structures, while said thin insulator mask protects underlying, said second insulator layer, in said peripheral, non-DRAM device region;

forming said crown shaped capacitor structure, via formation of a capacitor dielectric layer, on said crown shaped, storage node structures, followed by the formation of upper plate structures, with said thin insulator mask removed in said peripheral, non-DRAM device region, in situ after formation of said upper plate structure; and forming a planarized fourth insulator layer, overlying said crown shaped capacitor structures, and overlying said second insulator layer, in said peripheral, non-DRAM device region.

2. The method of claim 1, wherein said first insulator layer is either a silicon oxide layer, or a borophosphosilicate glass, (BPSG), layer, obtained via LPCVD or PECVD procedures, at a thickness between about 3000 to 7000 Angstroms.

3. The method of claim 1, wherein said storage node contact plugs are comprised of polysilicon, doped with phosphorous, resulting in a surface concentration between about 1E19 to 1E21 atoms/cm$^3$.

4. The method of claim 1, wherein said second insulator layer is a silicon oxide layer, or a BPSG layer, obtained via LPCVD or PECVD procedures, at a thickness between about 9000 to 10000 Angstroms.

5. The method of claim 1, wherein said thin insulator mask is comprised of silicon nitride, or of silicon oxynitride, at a thickness between about 100 to 500 Angstroms.

6. The method of claim 1, wherein said third insulator layer is a silicon oxide layer, or a BPSG layer, obtained via LPCVD or PECVD procedures, at a thickness between about 3000 to 5000 Angstroms.

7. The method of claim 1, wherein said capacitor openings are formed in said third insulator layer, and in said second insulator layer, via an anisotropic RIE procedure, using $CHF_3$ as an etchant, with the width or diameter, of said capacitor openings, between about 3500 to 4500 Angstroms, and with the space between said capacitor openings between about 1000 to 2000 Angstroms.

8. The method of claim 1, wherein said crown shaped storage node structures are comprised of polysilicon, at a thickness between about 500 to 1000 Angstroms.

9. The method of claim 1, wherein said crown shaped storage node structures are comprised of hemispherical grain silicon, at a thickness between about 500 to 1000 Angstroms.

10. The method of claim 1, wherein said third insulator layer, and said second insulator layer are selectively removed, in said DRAM device region, via a buffered hydrofluoric acid solution, or via a dilute hydrofluoric acid solution.

11. The method of claim 1, wherein said fourth insulator layer is a silicon oxide layer, or a BPSG layer, obtained via LPCVD or PECVD procedures, at a thickness between about 2000 to 5000 Angstroms.

12. The method of claim 1, wherein said fourth insulator layer is planarized via use of a chemical mechanical polishing procedure.

13. A method of forming a planarized top surface topography for an insulator layer, overlying DRAM devices, that are comprised with a crown shaped, capacitor structure, and located in a first region of a semiconductor substrate, and overlying peripheral devices, in a second region of said semiconductor substrate, and featuring the use of a thin silicon nitride shape, used a hard mask to protect insulator layers, located in said peripheral region, from insulator wet etch procedures, used in the formation of said crown shaped, capacitor structures, comprising the steps of:

providing a first group of transfer gate transistors, with source/drain regions, in said first region of said semiconductor substrate, to be used for said DRAM devices, and forming a second set of transfer gate transistors, in a second region of said semiconductor substrate, to be used for said peripheral devices;

depositing a first silicon oxide layer;

planarizing said first silicon oxide layer;

forming storage node contact holes, in said first silicon oxide layer, exposing said source/drain regions, of said first group of said transfer gate transistors;

forming polysilicon storage node contact plugs, in said storage node contact holes;

depositing a second silicon oxide layer;

forming said thin silicon nitride shape, on a region of said second silicon oxide layer that is located in said peripheral region;

depositing a third silicon oxide layer;

forming capacitor openings in said third silicon oxide layer, and in said second silicon oxide layer, exposing the top surface of said polysilicon storage node contact plugs, in the DRAM device region;

depositing a silicon layer, on the sides, and at the bottom, of said capacitor openings, and on the top surface of said third silicon oxide layer;

applying a photoresist layer; on a portion of said silicon layer, located on said third silicon oxide layer, in said peripheral region, on a portion of said silicon layer located on the surfaces of said capacitor openings; and on the top surface of said third silicon oxide layer, located in said DRAM device region;

performing a first chemical mechanical polishing procedure to remove a top portion of said photoresist layer, exposing the top surface of said silicon layer, located on the top surface of said third silicon oxide layer, while forming photoresist plugs, in said capacitor openings;

performing a second chemical mechanical polishing procedure to remove the portions of said silicon layer, from the top surface of said third silicon oxide layer, and to remove a top portion of said third silicon oxide layer, resulting in a bottom portion of said third silicon oxide layer, on said thin silicon nitride shape, in said peripheral region, and resulting in crown shaped storage node shapes, in said capacitor openings, in said DRAM device region;

removing said bottom portion of said third silicon oxide layer, and said second silicon oxide layer, in said DRAM device region, exposing the vertical features of said crown shaped storage node structures, while removing only said bottom portion of said third silicon oxide layer, from the top surface of said thin silicon nitride shape, in said peripheral region;

forming a capacitor dielectric layer, on said crown shaped storage node structures;

depositing a polysilicon layer, completely filling the spaces between said crown shaped storage node structures, and completely filling the spaces between said vertical features of said crown shaped storage node structures;

performing a dry etch procedure to remove a portion of said polysilicon layer, from the top surface of said thin silicon nitride shape, in said peripheral region, while forming a polysilicon upper plate structure, on said capacitor dielectric layer, in said DRAM device region, resulting in said crown shaped, capacitor structure, comprised of said polysilicon upper plate structure, said capacitor dielectric layer, and said crown shaped storage node structures;

continuing said dry etching procedure to remove the portion of said thin silicon nitride shape, exposed in said peripheral region;

depositing a fourth silicon oxide layer; and planarizing said fourth silicon oxide layer, resulting in said planarized top surface topography for said fourth silicon oxide layer, located overlying said DRAM device region, and said peripheral region.

14. The method of claim 13, wherein said first silicon oxide layer is obtained via LPCVD or PECVD procedures, at a thickness between about 3000 to 7000 Angstroms.

15. The method of claim 13, wherein said first silicon oxide layer is planarized using chemical mechanical polishing.

16. The method of claim 13, wherein said storage node contact holes are formed in said first silicon oxide layer, via an anisotropic RIE procedure, using $CHF_3$ as an etchant.

17. The method of claim 13, wherein said polysilicon storage node contact plugs are formed from a polysilicon layer, doped with phosphorous, resulting in a surface concentration for said polysilicon storage node contact plugs between about 1E19 to 1E21 atoms/cm$^3$.

18. The method of claim 13, wherein said second silicon oxide layer is obtained via LPCVD or PECVD procedures, at a thickness between about 9000 to 10000 Angstroms.

19. The method of claim 13, wherein said thin silicon nitride shape, is obtained via deposition of a silicon nitride layer, via LPCVD or PECVD procedures, at a thickness between about 100 to 500 Angstroms, and patterned via a RIE procedure, using $Cl_2$ as an etchant.

20. The method of claim 13, wherein said third silicon oxide layer is obtained via LPCVD or PECVD procedures, at a thickness between about 3000 to 5000 Angstroms.

21. The method of claim 13, wherein said capacitor openings are formed in said third silicon oxide layer, and in said second silicon oxide layer, via an anisotropic RIE procedure, using $CHF_3$ as an etchant, with the width, or diameter of said capacitor openings between about 3500 to 4500 Angstroms, and with a space between said capacitor openings between about 1000 to 2000 Angstroms.

22. The method of claim 13, wherein said crown shaped storage node structures are comprised from said silicon layer, a polysilicon layer, obatined via LPCVD procedures, at a thickness between about 500 to 1000 Angstroms.

23. The method of claim 13, wherein said crown shaped storage node structures are comprised from said silicon layer, a hemispherical grain silicon layer, obtained via LPCVD procedures, at a thickness between about 500 to 1000 Angstroms.

24. The method of claim 13, wherein said vertical features, of said crown shaped capacitor structures, are exposed via removal of said third silicon oxide layer, and of said second silicon oxide layer, via use of a buffered hydrofluoric acid solution, or via the use of a dilute hydrofluoric acid solution.

25. The method of claim 13, wherein said fourth silicon oxide layer is obatined via LPCVD or PECVD procedures, at a thickness between about 2000 to 5000 Angstroms.

26. The method of claim 13, wherein planarization of said fourth silicon oxide layer is accomplished via a chemical mechanical polishing procedure.

* * * * *